United States Patent [19]

Saeki et al.

[11] Patent Number: 4,900,501

[45] Date of Patent: Feb. 13, 1990

[54] METHOD AND APPARATUS FOR ENCAPSULATING SEMI-CONDUCTORS

[75] Inventors: Junichi Saeki; Aizo Kaneda, both of Yokohama; Masakazu Ozawa, Yonezawa; Takashi Nakagawa, Takasaki; Kunihiko Nishi, Kokubunji, all of Japan

[73] Assignee: Hitachi, Ltd., Tokyo, Japan

[21] Appl. No.: 924,773

[22] Filed: Oct. 30, 1986

[30] Foreign Application Priority Data

Nov. 8, 1985 [JP] Japan ................. 60-248715

[51] Int. Cl.$^4$ ............... B29C 45/14; B29C 45/26
[52] U.S. Cl. ............... 264/272.17; 249/85; 425/116
[58] Field of Search ............... 249/83, 119, 85; 425/116, 117, 121, 122, 126 R, 128, 129 R; 264/272.14, 272.17, 299, 297.1–297.3; 437/206, 207, 217, 220, 224; 357/70; 361/421; 174/52.1, 52.2

[56] References Cited

U.S. PATENT DOCUMENTS

| | | | |
|---|---|---|---|
| 3,440,027 | 4/1969 | Hugle | 174/52.2 |
| 3,484,533 | 12/1969 | Kaufman | 174/52 FP |
| 3,611,061 | 10/1971 | Segerson | 174/52.2 |
| 3,651,448 | 3/1972 | Pauza | 174/52.2 |
| 3,672,046 | 6/1972 | Storey et al. | 437/217 |
| 3,698,074 | 10/1972 | Helda et al. | 174/52 FP |
| 3,716,764 | 2/1973 | Birchler et al. | 437/220 |
| 4,368,168 | 1/1983 | Slepcevic | 264/272.17 |
| 4,404,744 | 9/1983 | Stenz et al. | 264/272.14 |
| 4,513,942 | 4/1985 | Creasman | 264/272.17 |
| 4,599,062 | 7/1986 | Konishi | 264/272.17 |
| 4,632,653 | 12/1986 | Plocher | 425/129 R |

FOREIGN PATENT DOCUMENTS

| | | | |
|---|---|---|---|
| 46-37098 | 11/1971 | Japan | 425/117 |
| 0012741 | 2/1981 | Japan | 437/207 |
| 0217313 | 12/1983 | Japan | 264/272.17 |

OTHER PUBLICATIONS

Anon., Electronics Review, "Manufacturing", Jul. 24, 1967, pp. 36–38.

Primary Examiner—Willard E. Hoag
Attorney, Agent, or Firm—Antonelli, Terry & Wands

[57] ABSTRACT

A resin-molded semiconductor is produced by using an apparatus which comprises a mold having a plurailty of pots from which a molding resin is fed under pressure, mutually independent runners extending from each pot, and a plurality of cavities serially disposed at the end of each runner, said cavities being filled with a molding resin fed under pressure from said pots, with a part to be molded placed in each cavity. The process and apparatus of this invention prevent the molding defects resulting from the excessive flow resistance of resin and greatly improves the use efficiency of resin.

4 Claims, 3 Drawing Sheets

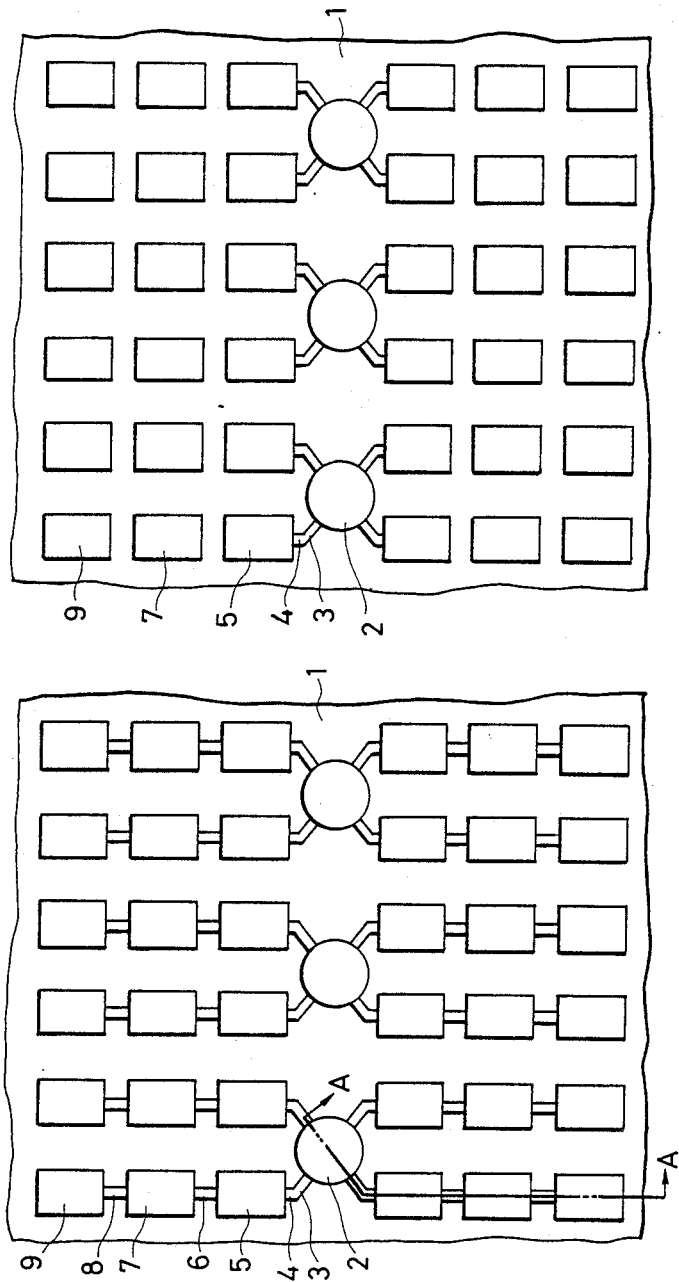

METHOD AND APPARATUS FOR ENCAPSULATING SEMI-CONDUCTORS

BACKGROUND OF THE INVENTION

The present invention relates to a resin-molded semiconductor and to an apparatus for producing the same. More particularly, it relates to a resin-molded semiconductor which can be produced with an improved use efficiency of resin and to an apparatus provided with a mold for the resin-molded semiconductor.

Recently the multipot molding system has come into general use to rationalize the molding step for semiconductors. According to this system, one mold is provided with a plurality of pots and plungers and the molding resin is transferred into each cavity from each pot through a short runner. An advantage of this system over the conventional monopot molding system is that the molding resin can be used efficiently and the molding cycle can be reduced. On the other hand, this system compels one to use an extremely expensive molding resin incorporated with a large amount of high-purity filler in the case of semiconductors such as memory packages which require a high reliability. This makes it necessary to improve the use efficiency of resin to a great extent.

An example of the conventional multipot molding apparatus is disclosed in Japanese Patent Publication No. 35576/1982. It is constructed such that one mold has a plurality of pots and the molding resin is fed under pressure to them through the runners which are independent from one another. However, it is still unsatisfactory in the use efficiency of molding resin. In other word, there is a limit in improving the ratio of the amount of resin in the cavity to the amount of total resin including resin in pots and runners. This is because the cavities are disposed in parallel with each runner and the flow path in the mold is limited in layout.

Another example of the conventional apparatus is disclosed in Japanese Utility Model Publication No. 154074/1981. The mold in this utility model is constructed such that a plurality of lead frames are disposed at one side of and in parallel with the runner in the mold. In other words, a plurality of cavities are disposed in the direction perpendicular to the runner. This mold has one pot from which resin is filled through a long runner into a plurality of cavities disposed in parallel with and at a right angles to the runner. This arrangement gives rise to a large flow of resin in the runner, and this leads to an increased pressure loss due to flow resistance. If the sectional area of the runner is reduced to improve the use efficiency of resin, the flow resistance increases more, making it impossible to transfer the resin within a preset time. This leads to the occurrence of internal defects such as voids. For this reason, the runner has to have a certain sectional area and hence there is a limit in improving the use efficiency of resin.

SUMMARY OF THE INVENTION

It is an object of the present invention to provide a resin-molded semiconductor and an apparatus for producing the same. The apparatus of this invention prevents the occurrence of molding defects resulting from the increase in flow resistance of resin and also greatly improves the use efficiency of resin.

According to this invention, the mold is provided with a plurality of pots from which the molding resin is supplied under pressure. Each pot has runners which are independent from other runners. Each runner extends to a plurality of cavities disposed in series. With the cavities each holding an electronics part to be molded, the molding resin is fed to the cavities from each of the pots.

BRIEF DESCRIPTION OF THE DRAWINGS

FIG. 1 is a plan view of the bottom part of the mold pertaining to one embodiment of the apparatus for producing semiconductor in this invention.

FIG. 2a is a sectional view, with the cavities not yet filled with a resin. FIG. 2b is a sectional view, with the cavities being filled with a resin. FIG. 2c is a sectional view, with the cavities filled with a resin.

FIG. 3 is a plan view of the bottom part of the mold pertaining to another embodiment of the apparatus for producing semiconductor in this invention.

DESCRIPTION OF THE PREFERRED EMBODIMENTS

The present invention provides a mold which has a plurality of pots, runners independently connected to said pots, and a plurality of cavities serially connected to the end of each runner. The advantage of this mold over the one-pot mold is that the runners are very short, the resin flow in the runner is small, and the pressure loss of flowing resin is small.

In an experiment with a mold in which one cavity is connected to each runner, it was confirmed that the pressure loss in the multipot system is only one-tenth that in the one-pot system having the same number of cavities. The experimental result is also true of molding with a mold having a plurality of pots, independent runners connected to each pot, and a plurality of cavities connected to the end of each runner. The pressure loss in such a mold is much lower than that in the one-pot system. Therefore, the molding with such a mold results in none of molding defects attributable to the increased pressure loss and improves the use efficiency of resin to a great extent.

The embodiments of this invention are described in more detail with reference to FIGS. 1 to 5.

FIG. 1 is a plan view of the bottom part of the mold pertaining to one embodiment of this invention.

Figure 2A:
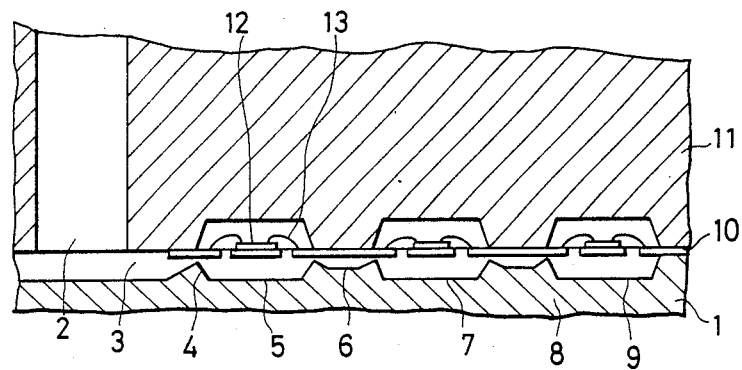
FIGS. 2a to 2c are sectional views of the mold, with the top part and the bottom part closed, on the line A—A in FIG. 1.
Figure 2B:
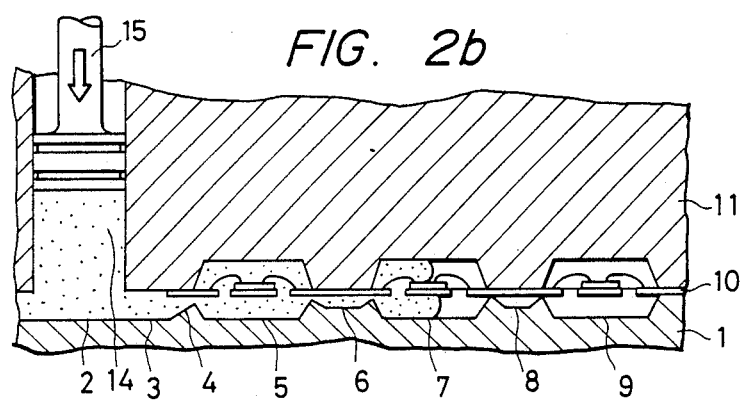
Figure 2C:
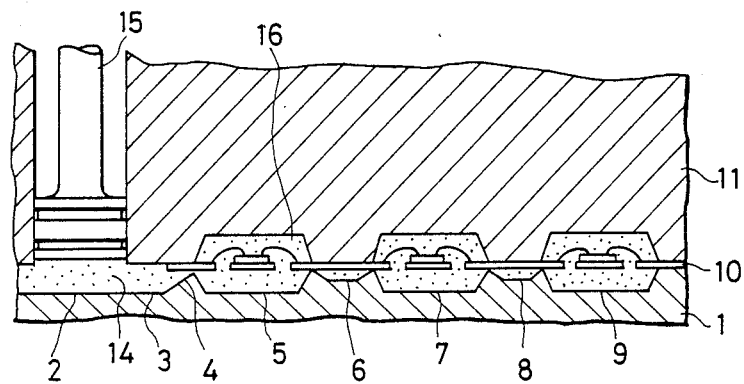

FIG. 2 is a sectional view of the mold, with the top part and the bottom part closed, on the line A—A in FIG. 1. FIG. 2a is a sectional view, with the cavities not yet filled with a resin. FIG. 2b is a sectional view, with the cavities being filled with a resin. FIG. 2c is a sectional view, with the cavities filled with a resin.

Referring to FIG. 1, there are shown the bottom part 1 of the mold, a plurality of pots 2 (three in this FIGURE) from which a molding resin is fed under pressure, and runners 3 independently connected to each pot 2. The runner 3 extends to a first gate 4, which adjoins a first cavity 5. Said first cavity 5 is followed by a second gate 6, which adjoins a second cavity 7. Said second cavity 7 is further followed by a third gate 8, which adjoins a third cavity 9. In other words, three cavities are serially disposed at the end of each runner.

FIG. 2a is a sectional view of the top part 11 and the bottom part 1 of the mold, with a lead frame 10 interposed between them, on the line A—A in FIG. 1. Incidentally, the like symbols in FIGS. 1 and FIGS. 2a to 2c denote the like parts.

The lead frame 10 holds a chip 12 in each of said first cavity 5, said second cavity 7, and said third cavity 9. Each chip is connected to the lead frame 10 by a gold wire 13, so that the electronics part to be molded is formed.

FIG. 2b shows the resin 14 running from the pot 2 through the flow path in the mold under the pressure of the plunger 15. The resin 14 has passed through the runner 3, the first gate 4, the first cavity 5, and the second gate 6 and is going to enter the second cavity 7.

FIG. 2c shows a stage of the molding cycle in which the resin has reached as far as the cavity 9 and the plunger 15 stands still. This stage continues for a predetermined time in which the resin 14 cures. Then the plunger 15 is raised, the top part 11 and the bottom part 1 are opened, and the molded product 16 is removed from the mold. Extra parts such as runners and gates are removed from the molded products, and the lead frame 10 is cut and folded, whereby the resin-molded semiconductors are completed.

Figure 5:
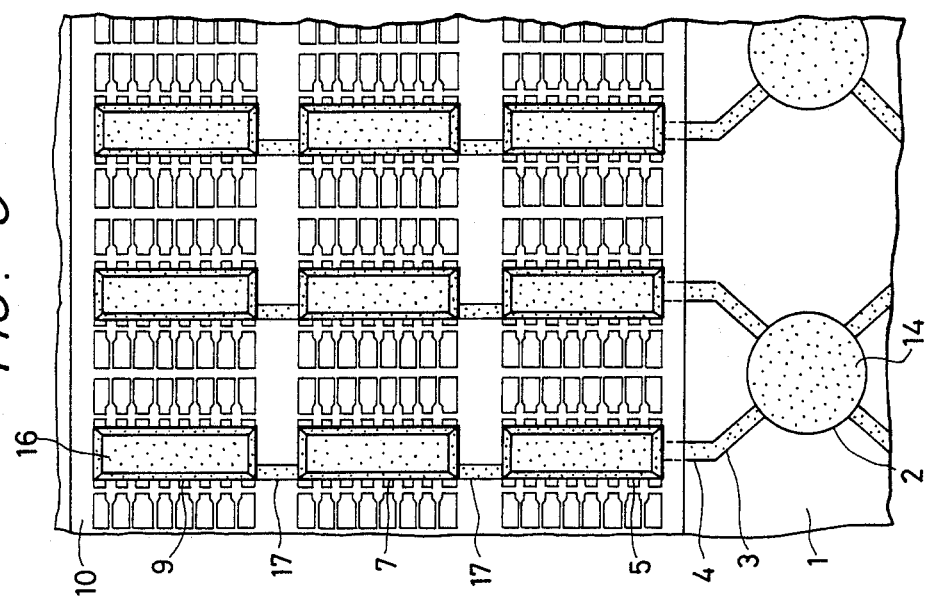
FIG. 5 is a plan view of the bottom part in which the lead frames shown in FIG. 4 are filled with a resin.
Figure 4:
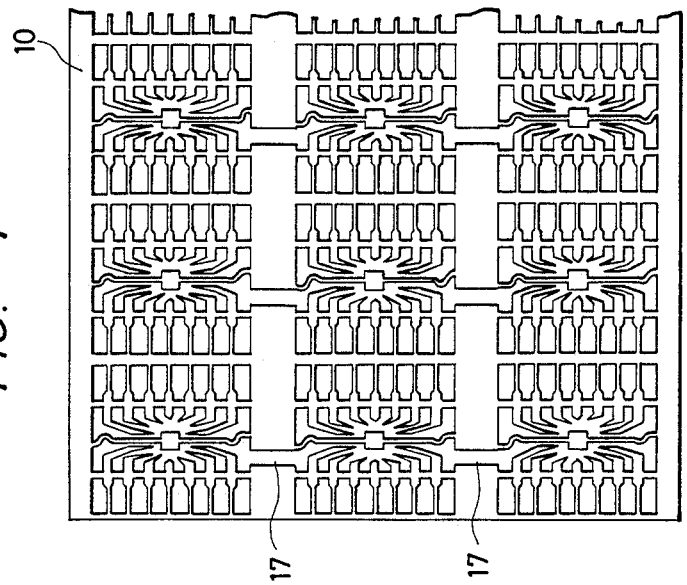
FIG. 4 is a front view of the lead frames to be used for the mold shown in FIG. 3.

Another embodiment of this invention is described with reference to FIGS. 3 to 5. FIG. 3 is a plan view of the bottom part of the mold used in the embodiment. FIG. 4 is a plan view of the lead frame used for the mold as shown in FIG. 3. FIG. 5 is a plan view of the bottom part filled with the resin. In FIGS. 3 to 5, the like symbols in FIG. 1 denote the like parts.

In this embodiment, the mold has a plurality of pots 2, and each pot has runners 3 which are independent from one another. A runner 3 extends to a first gate 4, which adjoins a first cavity 5. The embodiment shown in FIG. 3 differs from that shown in FIG. 1 above in that a second cavity 7 and a third cavity 9 are disposed independently but a second gate and a third gate are not formed in the mold.

Instead, the lead frame placed in the mold shown in FIG. 3 has slits 17 at the respective positions corresponding to the second and third gates, so that the resin is fed to the second cavity 7 and the third cavity 9.

FIG. 5 is a plan view of the bottom part 1 at the stage of a cycle in which the resin feeding has been completed, with the lead frame 10 (as shown in FIG. 4) held between the bottom part 1 (as shown in FIG. 3) and the top part (not shown).

In this embodiment, the resin 14 forced out of the pot 2 passes through the runner 3 and the first gate 4 to fill the first cavity 5. The resin further passes through the slit 17 to reach the second cavity 7 and then through the second slit 17 to reach the third cavity 9. The subsequent procedure is the same as that in the first embodiment. Thus there are obtained the resin-molded semiconductors.

The advantage of the embodiment is that molding defects resulting from the excessive flow resistance of resin can be eliminated and the use efficiency of resin can be greatly improved. Thus the process of this invention makes it possible to rationalize the molding process while keeping the quality required for the resin-molded semiconductor.

Incidentally, the embodiments mentioned above are designed such that three cavities are serially disposed for each runner; but the scope of this invention is not limited to them. The number of cavities can be properly selected according to the size of the molded product and the flowability of resin.

As mentioned above, the present invention provides a process and apparatus for producing resin-molded semiconductors which prevent the molding defects resulting from the excessive flow resistance of resin and greatly improves the use efficiency of resin.

What is claimed is:

1. In a method for producing resin-encapsulated semiconductors the steps comprising; providing a mold having a plurality of pots from which a molding resin is fed under pressure, mutually independent runners extending from each pot, and a plurality of cavities serially disposed at an end of each runner, wherein a first cavity in each series located at the nearest position from a pot is connected to a runner through a gate, and each further cavity in each series is connected to each adjacent cavity in each series only through a slit formed as a flow channel in a lead frame interposed between a top part and a bottom part of said mold; discharging said resin from said pots into said runners such that said resin is fed only to said first cavity of each series through said gate; and discharging said resin from a cavity to an adjacent cavity only through said slit sequentially up to the last cavity in each series.

2. An apparatus for producing resin-molded semiconductors which comprises a mold having a plurality of pots from which a molding resin is fed under pressure, mutually independent runners extending from each pot, and a plurality of cavities serially disposed at the end of each runner, each of said runners being connected directly only to a first of said cavities in an associated series, a first of said cavities in each series being connected with one of said runners through a gate, and further of said cavities in each series being connectable with adjacent cavities in each series only through slits formed in a lead frame interposed between a top part and a bottom part of said mold.

3. An apparatus for producing resin-encapsulated semiconductors which comprises a mold having a plurality of pots from which a resin is fed under pressure, mutually independent runners extending from each pot, a plurality of cavities serially disposed at the end of each runner, each of said runners being connected directly only to a first of said cavities in an associated series, the mold having a top part and a bottom part, said top part and said bottom part being provided so as to hold a lead frame interposed therebetween, the top and bottom mold parts being provided such that a lead frame having a plurality of lead frame sections each associated with a chip, said lead frame sections being arranged to extend in two directions, can be held between the top and bottom mold parts.

4. A method for producing resin-encapsulated semiconductors which comprises:
providing a mold having a plurality of pots from which a molding resin is fed under pressure, mutually independent runners extending from each pot, and a plurality of cavities serially disposed at the end of each runner;
interposing a lead frame between a top part and a bottom part of said mold; and
discharging said resin from said pots into said runners to fill said cavities sequentially.
wherein said lead frame comprises a plurality of lead frame sections, each associated with a chip, said lead frame sections being arranged to extend in two directions.

* * * * *